United States Patent
Radley et al.

(10) Patent No.: US 6,573,509 B2
(45) Date of Patent: Jun. 3, 2003

(54) DETECTION SYSTEM

(75) Inventors: Ian Radley, Oxon (GB); Santokh Singh Bhadare, Middlesex (GB); Christopher Tyrrell, Bucks (GB)

(73) Assignee: Oxford Instruments Analytical Limited, Oxon (GB)

( * ) Notice: Subject to any disclaimer, the term of this patent is extended or adjusted under 35 U.S.C. 154(b) by 0 days.

(21) Appl. No.: 10/078,539

(22) Filed: Feb. 21, 2002

(65) Prior Publication Data

US 2002/0117628 A1 Aug. 29, 2002

(30) Foreign Application Priority Data

Feb. 27, 2001 (GB) ................................ 0104843

(51) Int. Cl.[7] ............................................. G01K 1/08
(52) U.S. Cl. ................................... 250/397; 250/370.15
(58) Field of Search ......................... 250/397, 310–311, 250/396 R

(56) References Cited

U.S. PATENT DOCUMENTS

| | | | |
|---|---|---|---|
| 4,851,684 A | 7/1989 | Martin et al. | 250/352 |
| 5,531,074 A | 7/1996 | Katagiri et al. | 62/6 |
| 5,816,052 A | 10/1998 | Foote et al. | 62/51.1 |
| 6,265,721 B1 * | 7/2001 | Arai et al. | 250/370.15 |

FOREIGN PATENT DOCUMENTS

GB    2 325 045    11/1998

OTHER PUBLICATIONS

Hosokawa Satoshi, Patent Abstracts of Japan, "Element Cooling Device For Eds Detector", Apr. 19, 1994.
Arai Shigetoshi, Patent Abstracts of Japan, "Cooling Type Semiconductor X–ray Detector", Feb. 9, 2001.

* cited by examiner

Primary Examiner—John R. Lee
Assistant Examiner—Christopher M. Kalivoda

(57) ABSTRACT

A detection system for detecting X-ray radiation from a sample located in a microbeam instrument. The detection system comprises:
  a. a pulse tube cooler;
  b. a compressor connected to the pulse tube cooler;
  c. a sensor coupled to the pulse tube cooler; and,
  d. a housing containing the pulse tube cooler and the sensor. The pulse tube cooler, the sensor and at least part of the housing are sufficiently small to be positioned inside the microbeam instrument in use, thereby allowing the X-ray radiation from the sample to be detected by the sensor.

18 Claims, 3 Drawing Sheets

DETECTION SYSTEM

FIELD OF THE INVENTION

The present invention relates to a detection system for detecting X-ray radiation from a sample located in a microbeam instrument.

DESCRIPTION OF THE PRIOR ART

Microbeam instruments comprise a vacuum within which a sample that emits X-rays is located and include scanning electron microscopes (SEMs), transmission electron microscopes (TEMs), scanning transmission electron microscopes (STEMs), electron probe microanalysers (EPMAs) and defect review tools (DRTs).

In such detection systems, it is typically necessary to cool the sensor down to a temperature of around 90K. In the past, this has typically been achieved by connecting a large reservoir of liquid nitrogen to the sensor by a series of copper components. The copper components then operate to transfer heat from the sensor to the liquid nitrogen reservoir thereby maintaining the sensor at an operating temperature.

In recent years however, there has been a shift in design to replace the liquid nitrogen reservoir by a cooling device that is powered by electricity. Current commercial peltier cooling technology does not allow such low temperatures to be achieved. Accordingly candidate cooling devices typically use a compressor and thermodynamic cycle arrangement to achieve the low temperatures.

One such design is shown in GB-A-2325045. This describes an energy dispersive type semi-conductor (EDS) detector which is mounted inside a cryostat which is in turn slidably mounted to a system such as a scanning electron microscope (SEM). The cryostat is formed from a pulse tube refrigerator which operates to generate the low temperatures needed to cool the sensor. The pulse tube refrigerator is located at one end of the cryostat and is coupled to the sensor, located at the other end of the cryostat, by a cold finger. Heat is transferred along the cold finger from the sensor to the pulse tube cooler allowing the sensor to be maintained at the desired temperature.

However, this suffers from the major drawback that the sensor is cooled by the cold finger which results in a large loss in cooling efficiency. In particular, heat is generally absorbed along the entire length of the cold finger and accordingly, the pulse tube cooler must provide significantly more cooling power to ensure that the sensor is maintained at operating temperature. This has two main effects.

Firstly, a larger amount of energy is required to operate the system. Secondly, the compressor which drives the pulse tube cooling system must be of a sufficiently large size to obtain the cooling power. As a result, the compressor must be mounted separately to the pulse tube generator. In order to achieve this, at least one rotating valve is required to couple the compressor to the pulse tube which in turn leads to further losses in efficiency.

A second example of a system implementing a pulse tube generator is described in the Japanese publication JP-A-06109339. Again, in this example, a cold finger is used to connect the pulse tube refrigerator to the sensor to be cooled. Accordingly, this suffers from similar problems to those outlined above with respect to the system described in GB-A-2325045.

SUMMARY OF THE INVENTION

In accordance with the present invention, we provide a detection system for detecting X-ray radiation from a sample located in a microbeam instrument, the detection system comprising:

a. a pulse tube cooler;
b. a compressor connected to the pulse tube cooler;
c. a sensor coupled to the pulse tube cooler; and,
d. a housing containing the pulse tube cooler and the sensor, wherein the pulse tube cooler, the sensor and at least part of the housing are sufficiently small to be positioned inside the microbeam instrument in use, thereby allowing the X-ray radiation from the sample to be detected by the sensor.

The invention provides a number of benefits. Firstly, by positioning the pulse tube cooler within the housing, it can be inserted into, typically the vacuum enclosure of, a microbeam instrument.

Secondly, positioning the sensor and the pulse tube cooler together inside the housing reduces the cooling effect required by the pulse tube cooler to keep the sensor at the desired temperature. This in turn improves the efficiency of the system allowing a smaller compressor to be used. The compressor can then be mounted on the instrument or even on the housing thereby further improving the efficiency of the cooling system in complete contrast to the conventional arrangements in which the compressor is floor mounted.

The conventional configurations for cooling sensors as described above in the introduction typically place a heat load on the cooler of approximately 2 watts. The present invention however by mounting the pulse tube cooler in the housing with the sensor can reduce the cooling power requirements from 2 watts to approximately 300 milliwatts.

The housing is preferably adapted to thermally insulate the sensor and the pulse tube cooler from the surroundings. Accordingly, the housing can be formed from a silvered thermally isolating material such as polished stainless steel to help further reduce heat loads on the sensor and the cooler.

Typically however, this is achieved by having the pulse tube cooler and the sensor maintained in a vacuum within the housing. The vacuum level is typically obtained at about $10^{-6}$ millibars of pressure, thereby reducing heat transfer from the sensor and the pulse tube to the housing.

It is normally necessary to place the sensor as close to the sample as possible in order to achieve acceptable count rates in the detection system. Accordingly, when the detection system is mounted on to an SEM, it must be configured with the housing penetrating into the SEM with the compressor, which generates a large amount of heat, located outside the SEM housing. Accordingly, the housing preferably comprises an elongate outer tube having first and second ends, the sensor being positioned in the first end adjacent a window. This allows the sensor to achieve acceptable count rates.

In this situation, the pulse tube cooler is also usually positioned in the first end so that it can be directly coupled to the sensor.

The pulse tube cooler usually includes a cold heat exchanger with the sensor being attached to the cold heat exchanger via a short thermally conductive coupling. Minimizing the length of thermally conductive elements to couple the sensor to the cold heat exchanger increases the cooling efficiency of the system.

The pulse tube cooler is typically adapted to cool the sensor to a temperature below 150K, preferably below 100K, and if it is implemented as a multi-stage pulse stage cooler it could cool the sensor to a temperature of below 1K.

The sensor may be a superconductive tunnel type sensor or the like. Thus, this cooling system allows sensors such as Josephson Junction and Giaever Junction sensors, and microcalorimeters, such as transition edge sensors to be used.

As mentioned briefly above, an important application of the detection system is with an SEM. In this case the SEM usually includes a specimen chamber in which a sample to be imaged is positioned in use. In this case, the second end of the housing is coupled to a detector mounting on the SEM, the housing extending into the specimen chamber such that the first end is positioned adjacent the sample in use. In another case, the sample could be cut off from the rest of the specimen chamber by a thin walled "tent" of thin coated polymer for example. This "tent" would isolate the "clean" vacuum, in the close vicinity of the sample and incident electron beam, from the potentially "dirty" vacuum outside this region where peripheral detectors are inserted.

BRIEF DESCRIPTION OF THE DRAWINGS

An example of a detection system according to the present invention will now be described with reference to the accompanying drawings, in which:—

DESCRIPTION OF EMBODIMENT

Figure 1:
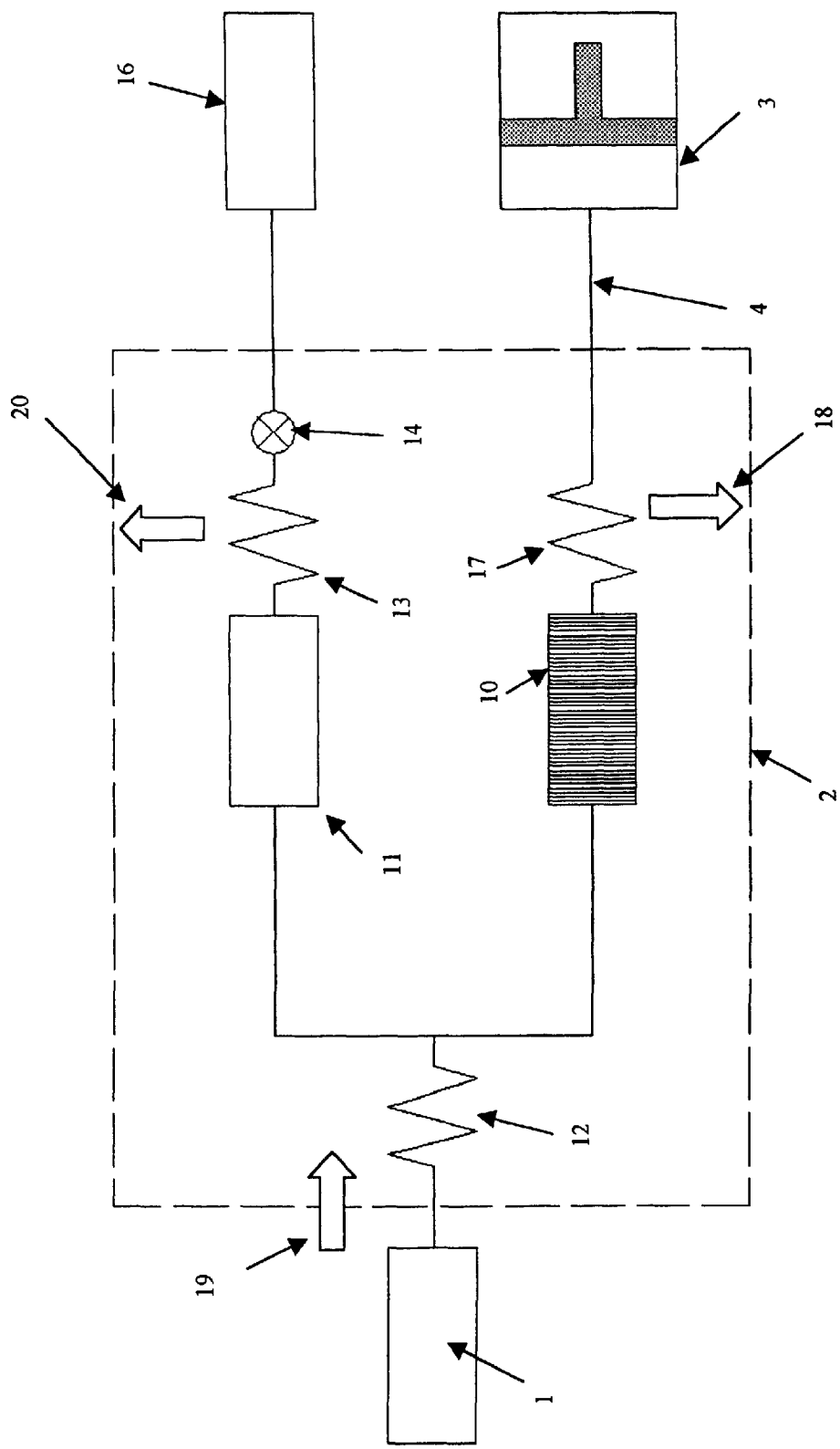
FIG. 1 is a schematic diagram of the elements of the detection system.

As shown in FIG. 1, the detection system includes an X-ray sensor 1 of conventional form coupled to a pulse tube cooler 2 which is in turn coupled to a compressor 3, via a continuous connecting pipe 4.

The pulse tube cooler 2 is typically an orifice pulse tube cooler which comprises a regenerator 10 and a pulse tube 11 coupled together via a cold end heat exchanger 12. The pulse tube is coupled to a hot end heat exchanger 13 which is in turn connected to an orifice 14. The orifice is used to connect the hot end heat exchanger 13 to a reservoir 16.

The operation of the pulse tube cooler 2 is roughly comparable to a Stirling cycle cooler which has no moving parts in the cold section. This means there is no frictional wear so that the low temperature sections have an infinite lifetime. Essentially there is no vibration induced in the cold section.

In use, the compressor 3 is used to compress a working gas, such as He. The compressed working gas flows along the continuous connecting pipe 4 from the compressor 3 to the compressor heat exchanger 17. The compressor heat exchanger 17 removes the heat generated by compressing the working gas in the compressor 3, as shown by the arrow 18, so that the pulse tube cooler can operate more efficiently.

The working gas then flows through the regenerator 10 which acts as a heat exchanger providing a way of getting the gas to the low temperature region of the pulse tube cooler 2 with as much potential cooling power as possible. Accordingly, the regenerator 10 does not operate to transfer heat in or out of the system but instead absorbs heat from the gas in one part of the pressure cycle and returns heat to the gas on a subsequent part.

After exiting the regenerator 10, the working gas enters the cold heat exchanger 12 which forms the coolest part of the system. Here, heat is absorbed from the sensor 1 as shown by the arrow 19.

The heated working gas is then transferred to the pulse tube 11 which utilizes the phase relationship between the pressure and the flow of the working gas in the pulse tube to ensure that heat is transported from the cold end to the warm end. The transported heat is then removed from the system by the hot heat exchanger 13 as shown by the arrow 20.

The orifice 14, the reservoir 16 and the pulse tube 11 operate in conjunction to ensure that the desired phase shift is provided at the cold end of the pulse tube 11, thereby allowing the heat transfer from the cold heat exchanger 12 to the hot heat exchanger 13.

Figure 2:
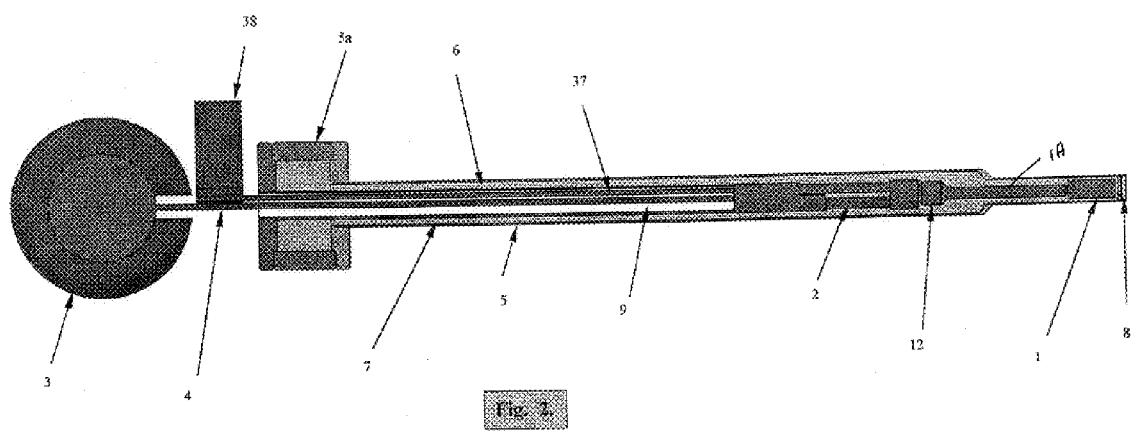
FIG. 2 is a schematic side view of a detection system shown in FIG. 1.

An example of the physical arrangement of the sensor system is shown in more detail in FIG. 2.

As shown, the sensor 1 and the pulse tube cooler 2 are mounted in a housing formed from an outer support tube 5 having a diameter of about 25 mm and an inner support tube 6. The inner support tube 6 is mounted substantially coaxially with the outer support tube 5, as shown, to define a cavity 7 which in use is held at a pressure near vacuum levels, such as about $10^{-6}$ millibar.

The outer tube 5 includes a shaped portion 5a for mounting purposes.

In use, the pulse tube cooler 2 and the sensor 1 are located in the cavity 7 at a first end of the housing as shown. The sensor 1 is positioned adjacent a window 8 to increase the chances of X-rays impinging on the sensor 1 and not being absorbed by the inner or outer tube material. As also shown, the sensor 1 is also coupled by a short thermal coupling 1A to the cold heat exchanger 12 of the pulse tube cooler 2 to ensure sufficient cooling.

As shown in FIG. 2, the inner tube 6 defines a region 9 which is open to the surrounding atmosphere and extends from the pulse tube cooler 2 to the second end of the housing. In use, the continuous connecting pipe 4 runs along the length of the inside of the inner tube 6 to connect the pulse tube cooler 2 to the compressor 3.

As will be appreciated by a person skilled in the art, the inner and outer support tubes 6, 5 are formed from thermally insulating materials, such as polished stainless steel so as to reduce heat absorption from the surroundings. Any heat generated by the pulse tube cooler 2 is conducted away along a pulse tube thermal coupling 37 (eg a heat pipe) for subsequent radiation into the surroundings via a heat sink or alternative heat exchanger 38 such as a water chiller.

By minimizing the length of the coupling 1A the amount of heat transfer required to maintain the sensor 1 at a desired operating temperature is reduced. This improves the efficiency of the device allowing the use of a smaller pulse tube cooler 2 and in turn the use of a smaller compressor 3. As a result of this, the detection system is more suitable for mounting to a scanning electron microscope or the like.

Although the housing is shown as one part, it could be made in sections, one section holding the pulse tube cooler and the other the sensor in a similar way to the arrangement shown in U.S. Pat. No. 4851684.

Figure 3:
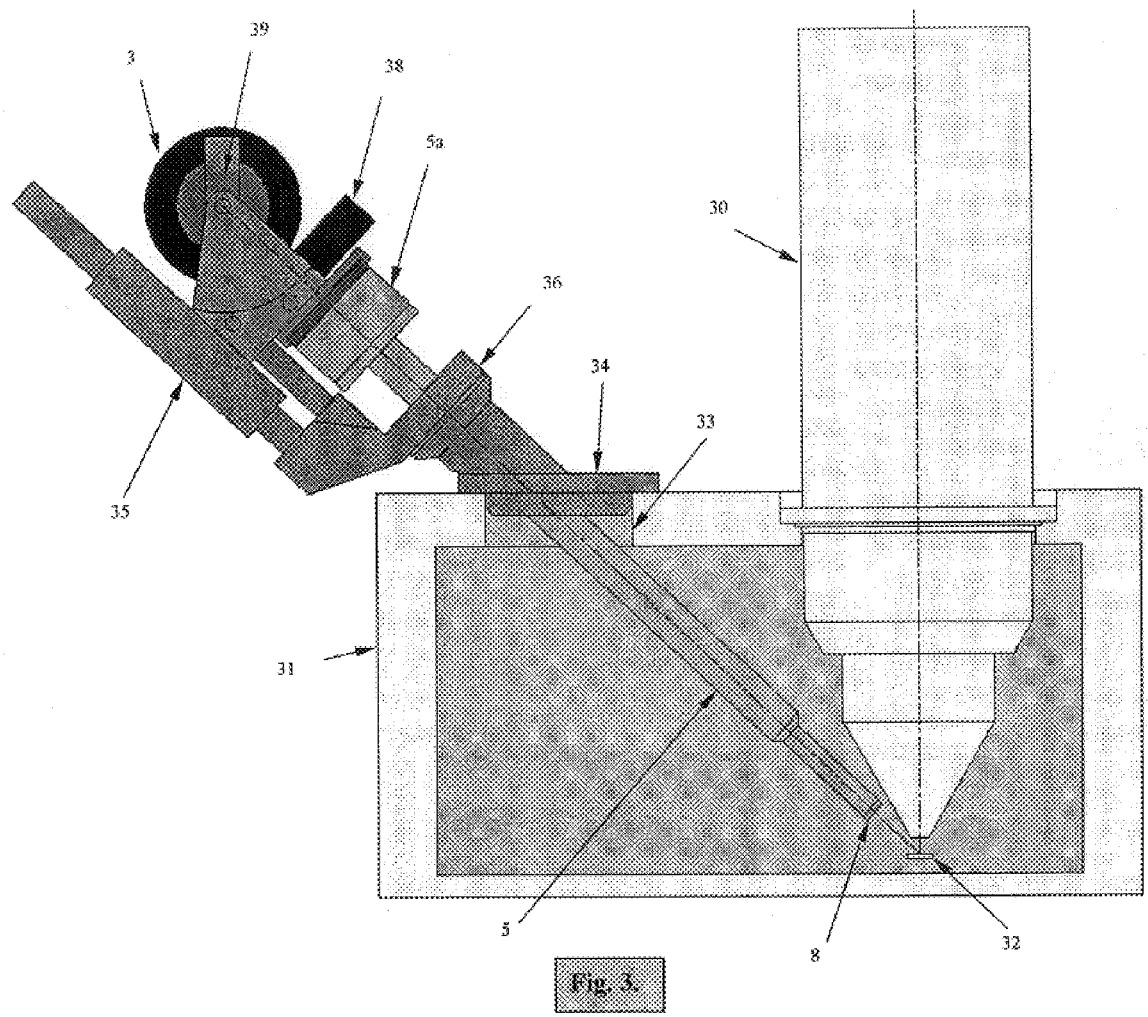
FIG. 3 is an example of the detection system of FIG. 2 when mounted to an SEM.

An example of the detection system when mounted to an SEM is shown in FIG. 3. As shown, the SEM includes an electron column 30 which is mounted in a microscope chamber 31. Also mounted in the microscope chamber is a sample 32. The microscope chamber is held under vacuum conditions as required.

In order to hold the detection system in place, the microscope chamber includes a mounting 34 which is positioned in an aperture 33. The mounting 34 is coupled to a detector chassis 35 by a connecting piece 36. The mounting 34, the connecting piece 36 and the detector chassis 35 are arranged so as to support the detection system as shown.

Accordingly, the sensor housing (outer tube 5 being visible) is inserted into the mounting 34 and the detector chassis 35 such that the outer tube 5 is supported by the mounting 34 with the window 8 positioned inside the microscope chamber 31 in an area adjacent the sample 32. As shown, the window 8 is directed towards the sample so as to ensure that the sensor is able to detect an added count rate of X-rays emitted from the sample 32.

The outer tube 5 and the shaped portion 5a cooperate with the detector chassis 35 to secure the detection system in place.

As shown, with the reduction in size of the compressor 3, the compressor 3 can be mounted to the detector chassis 35 thereby ensuring that the apparatus remains self-contained.

Vibration suppression from the compressor can be achieved by a combination of active electronic control of the input to the compressor and a flexible mounting 39 between the compressor 3 and detector chassis 35.

In a further alternative, when the microbeam instrument is not being used for X-ray analysis, the cooler can be operated at reduced power to reduce vibration and improve the imaging performance of the microbeam instrument. By operating in this low power "standby" mode, when full power is applied again, the time for the detector to cool to the required operating temperature is considerably less than if all power had been removed.

We claim:

1. A detection system for detecting X-ray radiation from a sample located in a microbeam instrument, the detection system comprising:
    a. a pulse tube cooler;
    b. a compressor connected to the pulse tube cooler;
    c. a sensor coupled to the pulse tube cooler; and,
    d. a housing containing the pulse tube cooler and the sensor,
    wherein the pulse tube cooler, the sensor and at least part of the housing are sufficiently small to be positioned inside the microbeam instrument in use, thereby allowing the X-ray radiation from the sample to be detected by the sensor.

2. A system according to claim 1, wherein the compressor is mounted in use directly or indirectly on the microbeam instrument.

3. A system according to claim 2, wherein the compressor is mounted on the housing.

4. A detection system according to claim 3, wherein the compressor is mounted on the housing via a flexible mounting which includes an active vibration damping mechanism.

5. A detection system according to claim 1, wherein the housing comprises an elongate outer tube having first and second ends, the sensor being positioned in the first end adjacent a window.

6. A detection system according to claim 5, wherein the pulse tube cooler is positioned in the first end.

7. A detection system according to claim 1, the detection system further comprising a pulse tube heat exchanger, for dissipating thermal energy from the pulse tube cooler.

8. A detection system according to claim 7, wherein the pulse tube heat exchanger is connected to the pulse tube cooler via a thermally conductive connector such that the pulse tube heat exchanger is located outside the microbeam instrument in use.

9. A detection system according to claim 1, wherein that part of the housing which is located in the microbeam instrument in use has a maximum outer diameter of 35 mm, preferably 25 mm.

10. A detection system according to claim 1, wherein the housing is adapted to thermally insulate the sensor and the pulse tube cooler from the surroundings.

11. A detection system according to claim 1, wherein the pulse tube cooler and the sensor are maintained in a vacuum within the housing.

12. A detection system according to claim 1, the pulse tube cooler including a cold heat exchanger, the sensor being attached to the cold heat exchanger.

13. A detection system according to claim 1, wherein the housing is made of two parts, one containing the sensor and the other containing the pulse tube cooler.

14. A detection system according to claim 1, wherein the pulse tube cooler is adapted to cool the sensor to a temperature of below 150K, preferably below 110K.

15. A detection system according to claim 1, wherein the pulse tube cooler is a multi-stage pulse tube cooler adapted to cool the sensor to a temperature of below 1K.

16. A detection system according to claim 15, wherein the sensor is a superconductive tunnel junction type sensor or a TES (transition edge sensor).

17. A microbeam instrument having a vacuum port; and a detection system comprising:
    a. a pulse tube cooler;
    b. a compressor connected to the pulse tube cooler;
    c. a sensor coupled to the pulse tube cooler; and,
    d. a housing containing the pulse tube cooler and the sensor,
    wherein the pulse tube cooler, the sensor and at least part of the housing are sufficiently small to be positioned inside the microbeam instrument in use, thereby allowing the X-ray radiation from the sample to be detected by the sensor, the detection system being inserted through said vacuum port.

18. A microbeam instrument according to claim 17, wherein the microbeam instrument is one of a scanning electron microscope, transmission electron microscope (TEM), scanning transmission electron microscope (STEM), electron probe microanalyser (EPMA) and defect review tool (DRTs).

* * * * *